United States Patent [19]

Vissers

[11] 4,267,599
[45] May 12, 1981

[54] ANTENNA TUNING SYSTEM

[75] Inventor: William Vissers, Cocoa Beach, Fla.

[73] Assignee: Gregory R. Ginn, Hermosa Beach, Calif.

[21] Appl. No.: 98,248

[22] Filed: Nov. 28, 1979

[51] Int. Cl.$^3$ .............................................. H04B 17/00
[52] U.S. Cl. .................................... 455/115; 455/123; 343/703; 324/58 A
[58] Field of Search .................. 455/115, 67, 121–123, 455/129, 117; 324/58 R, 58 A, 58 B, 95; 343/703

[56] References Cited

U.S. PATENT DOCUMENTS

| | | | |
|---|---|---|---|
| 3,117,279 | 1/1964 | Ludvigson et al. | 455/123 |
| 3,846,713 | 11/1974 | Kittel | 455/123 |
| 4,096,441 | 6/1978 | Schwartz | 455/115 |

Primary Examiner—Jin F. Ng
Attorney, Agent, or Firm—Laurence R. Brown

[57] ABSTRACT

There is provided a method of tuning an antenna after a transmitter is tuned using a dummy load by nulling a bridge having the antenna connected thereto and deriving energy from the transmitter coupled to the dummy load.

The antenna circuit is connected as one arm of a bridge circuit and a double pole double throw switch selects tune and transmit positions where the dummy load and antenna are respectively connected to the transmitter.

In the tuning position the transmitter is tuned while the antenna is effectively isolated so that it does not affect the transmitter tune up thereby simplifying and expediting tuning. The very small amount of power used to tune the antenna reduces the interference otherwise that would result from tune up of the antenna while connected to the transmitter. Thus, the antenna is tuned for a bridge circuit null indicating minimal standing waves before being connected to the transmitter for radio transmission.

During tuning of the transmitter the low resistive impedance of the dummy load prevents overload damage to the transmitter.

8 Claims, 3 Drawing Figures

ANTENNA TUNING SYSTEM

TECHNICAL FIELD

This invention relates to radio transmission and more particularly it relates to tuning radio antennas to a minimal standing wave ratio.

BACKGROUND ART

It is required for proper radio transmission that the standing wave ratio on the antenna be minimized to gain maximum transmission strength of signals from available transmitter power. Also, particularly with transistorized transmitters, it is necessary to prevent standing wave ratios which can overload or otherwise damage the transmitter equipment.

In the case of ham operators, where the transmitter may have its frequency changed often, the transmitter and antenna need be tuned for each change of frequencies. It is highly desirable not only to prevent tune up interference signals from being broadcast, but also to minimize tune up time and to assure the equipment will not be damaged or disabled.

It is conventional practice to have antenna tuning means connected with the antenna for tuning the antenna for proper impedance interface with the transmitter to minimize standing wave ratios, however, it has not been conventional practice to disconnect the transmitter from the antenna when tuning the antenna. The state of the art is described in the A.R.R.L. Antenna book published 1942 by The American Radio Relay League, Inc., West Hartford, Connecticut, in Chapter 4 relating to antenna coupling—tuned feeders—matching systems—adjustment. Also more recently issued U.S. Pat. No. 3,683,274—P. G. Martin, Aug. 8, 1972 and No. 4,096,441—E. L. Schwartz, June 20, 1978 are representative of standing wave ratio test instruments. However, this art does not in any way expedite or simplify the tuning process during tune up.

Accordingly, it is an object of this invention to provide a quick, safe and interference free means and method of tuning antennas to minimize standing wave ratios, which directly measures the antenna circuit while being energized with transmitted signals.

Other objectives, features and advantages of the invention will be found throughout the following description, drawings and claims.

DISCLOSURE OF THE INVENTION

This invention provides for simplified and expedited tuning of an antenna to minimize standing waves caused by antenna mismatch with a transmitter. To avoid transmission of interference signals while tuning to a desired frequency the transmitter is coupled to a dummy load of a known low impedance simulating the actual feeder system in the manner described on pages 108 and 109 of the above cited reference. A small portion of the signal is then derived and coupled to the antenna for tuning to a minimal standing wave ratio.

The measurement is made by connecting the antenna as one arm of an r-f bridge circuit balanced at the impedance of the dummy load, preferably a non-reactive resistive impedance to avoid any possibility of slight mistuning of the transmitter or antenna. Thus, the antenna is tuned in a comparative bridge arm or branch for a null current to match the impedance of the dummy load when the transmitter is tuned properly to its transmission frequency.

An instrument is provided in the form of a meter movement calibrated in a standing wave ratio scale connected in a bridge circuit with switching means for tune and transmit positions respectively connecting a transmitter to dummy load and the antenna. Also the meter is used in transmit position to monitor the transmitted power.

BRIEF DESCRIPTION OF THE DRAWINGS

The description which follows will refer to the accompanying drawing in which.

DETAILED DESCRIPTION OF A PREFERRED EMBODIMENT

Figure 1:
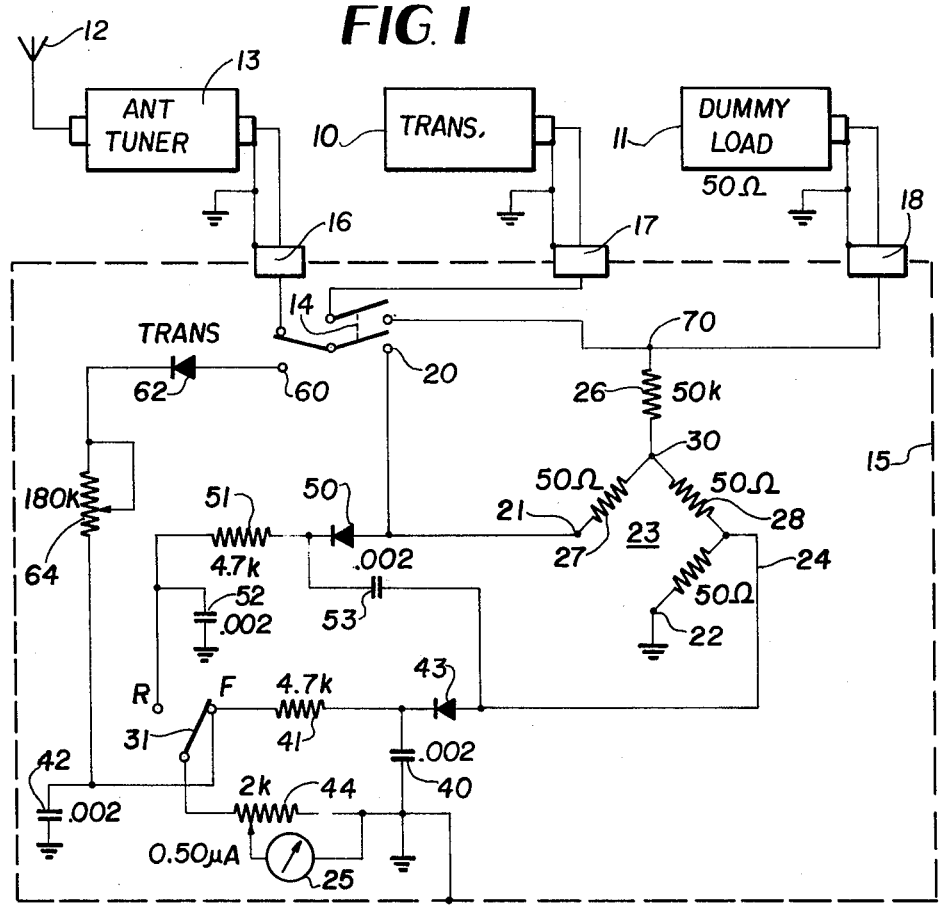
FIG. 1 is a schematic circuit diagram of a preferred embodiment of the invention.

As may be seen in FIG. 1 a transmitter 10 which may be transistorized and has a connection for driving a 50 ohm output circuit is coupled by means of double pole double throw switch 14 to either a dummy load 11 or an antenna 12 having tuner means 13. Although various packaging can be arranged, it is convenient to package a standing wave ratio instrument as provided by this invention in a cabinet 15 provided with coaxial connectors 16, 17, 18 for respective connection of conventional external antenna circuit 12, 13, transmitter 10 and dummy load 11. The dummy load is preferably a precision non-inductive resistor and in this embodiment has a resistance of 50 ohms.

Figure 3:
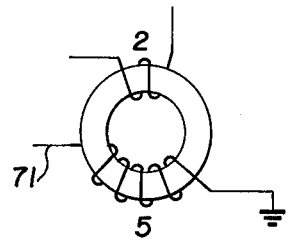
FIG. 3 is a schematic circuit fragment of an alternative circuit for coupling energy into the bridge measurement circuit used in this invention.

The switch 14 couples the antenna 12 to the switch terminal 20 and thus connects it as the arm or branch between terminals 21, 22 of the four-element bridge circuit 23, opposite resistor 24 which is a precision resistor of the same resistance (50 ohms) as the dummy load. The impedance (resistance) comparison of the antenna circuit is then read out on null meter 25, when driven by a small portion of the transmitter energy connected primarily to the dummy load 11. The energy sampling is accomplished by means of isolating resistor 26 thereby to complete the circuit with the bridge arrangement from terminals 30 to 22. The remaining two resistive arms of the bridge circuit are precision 50 ohm resistors 27, 28. This energy might be derived in other ways such as a small isolating transformer shown in FIG. 3 which comprises a T AMIDON T50-6 Core but it is preferable to keep non-resistive impedance out of the circuit to avoid any slight mistunings that could thereby result. The two turn primary is then connected in series with the line to the dummy load at terminal 70 of FIG. 1 with the five turn secondary terminal 71 connected to terminal 30 of the bridge.

The null meter 25, or equivalent current monitoring means, is connectable by means of switch 31 to read forward (F) or reflected (R) standing wave ratios, and is shown in the forward position. Thus, the meter with a 50 $\mu$A d-c movement is supplied d-c current derived from the r-f driving power through resistor 26. For tuning the antenna the meter is connected by switch 31 in the forward position (F) in a shunt path around resistive arm 24 as provided by the R-C rectifier filter 40, 41, 42 and diode 43, and is adjusted for a minimum null adjustment of antenna tuner 13. Calibration resistor 44 can be used to adjust the sensitivity of the meter 25.

To read the reflected standing wave ratio, the meter 25 is connected by switch 31 in shunt with the antenna bridge arm in the reflected (R) position and reads d-c current provided by rectifier diode 50, and the filter comprising resistor 51 and capacitors 52, 53.

In the transmit position of switch 14 terminal 60 serves to employ the meter 25 as a power output monitor (when the SWR is 1 to 1). Thus, power from the transmitter is sampled by rectifier diode 62 and resistor 64 through the d-c filter circuit 42, 41, 40 to produce the d-c drive current for meter 25. The resistance values (64 for example) can be selected to produce an appropriate scale reading on the meter 25 and is made variable for adjustment of the scale of meter 25 for an appropriate power calibration when connected to read power.

Figure 2:
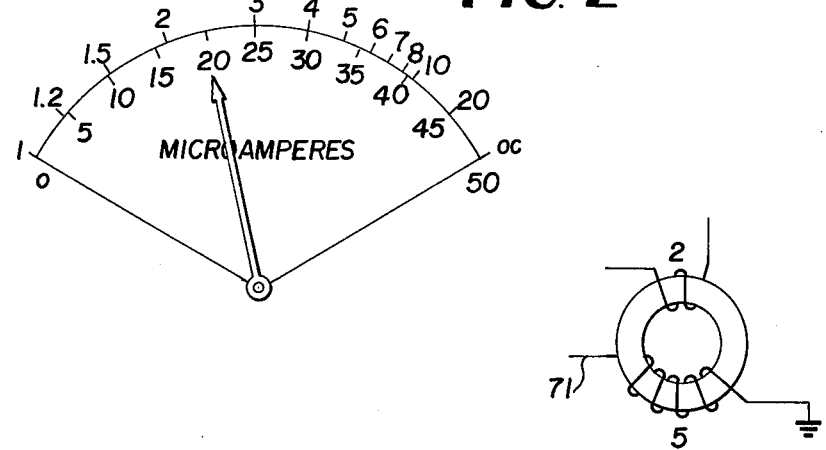
FIG. 2 is a view of a meter face calibrated to read standing wave ratio directly.

In FIG. 2 is shown a meter scale calibrated directly in standing wave ratio. The following formula is used to calibrate the scale, $$SWR = \frac{\text{Full Scale} + R}{\text{Full Scale} - R}$$

where R is the reflected meter reading as follows:

| F | R | SWR |
|---|---|---|
| 50 | 0 | 1 |
| 50 | 10.0 | 1.5 |
| 50 | 25 | 3.0 |
| 50 | 40 | 9.0 |
| 50 | 50 | ∞ |

Thus, the scale at 1 reads a 1 to 1 SWR and at 1.2 reads a 1 to 1.2 SWR, etc.

In operation with this system there is no need to adjust roughly and retune over and over again nor to manipulate both transmitter and antenna tuners at the same time because of interrelated tuning effects. The procedure is simply to adjust switch 14 to tune position and tune the transmitter with the dummy load in place with the transmitter on low or moderate power output typically 25 watts. Then the antenna is tuned for a null on meter 25 and the switch 14 returned to transmit position. At null the reading on forward (F) should be zero. That is the bridge circuit arrangement shown will cause a meter null at zero when the antenna branch between bridge terminals 21, 22 has an impedance of exactly the 50 ohms of precision resistors 24, 27, 28. Other equivalent bridge arrangements could be used.

Except for the precision resistors in the dummy load and bridge circuit, none of the other components are critical. It is to be understood that transmitter power can be varied for more r-f signal into the bridge, etc.

This invention therefore keeps the signal on the antenna while it is being tuned to such a low value that any interference is miniscule, and yet tunes the antenna with an actual r-f transmitter signal component while effectively decoupled from the transmitter so that a mistuned antenna does not affect the tuning of the transmitter. This simplifies and expedites the tuning process and eliminates interference.

Having therefore advanced the art with an improved antenna tuning system, those novel features of this invention believed descriptive of the spirit and nature of the invention are defined with particularity in the claims.

INDUSTRIAL APPLICATION

This invention provides an antenna tuning system and method minimizing standing wave ratio with a quick, simple tuning operation avoiding transmitted interference by use of a dummy load for tuning the transmitter and a bridge null circuit for tuning the antenna for minimal standing wave ratio.

I claim:

1. An antenna impedance matching system operable to eliminate standing waves caused by impedance mismatch comprising in combination,
   a transmitter,
   an antenna,
   a dummy load of known impedance,
   antenna tuning means adjustable to determine the antenna impedance coupled to the antenna,
   switching means connecting the transmitter, dummy load and antenna tuning means to the matching system,
   said switching means connecting the antenna tuning means, transmitter and dummy load respectively in transmitting and tuning positions by connecting the transmitter to the antenna tuning means in the transmitting position and to the dummy load in the tuning position to deliver transmitter power thereto,
   a bridge circuit having at least one impedance arm of the same impedance as the dummy load connected to the transmitter in said tuning position,
   circuit means connecting the antenna and tuning means in said tuning position as a variable impedance branch of the bridge circuit compared with the impedance of said impedance arm,
   means coupling power to said bridge circuit derived from the transmitter power delivered to the dummy load in said tuning position, and
   current monitoring means connected in the bridge circuit to indicate a null current when the antenna impedance matches the impedance of said impedance arm.

2. The system as defined in claim 1 including switching means coupling said current monitoring means selectively (a) to measure current respectively delivered to said antenna by the transmitter and (b) as said impedance branch of the bridge circuit.

3. The system as defined in claim 1 including circuit means connecting the current monitoring means to monitor the power output of the transmitter when said switching means is in the transmitting position.

4. The system as defined in claim 1 wherein said bridge circuit has three resistive arms and the antenna tuning means constitute a fourth branch.

5. The system as defined in claim 4 wherein the dummy load is a resistor and the means coupling power to said bridge consists of a resistive network connected to said dummy load.

6. The system as defined in claim 1 wherein the current monitoring means is a d-c meter, and said meter is connected in the tuning position of said switch to said bridge.

7. The system as defined in claim 6 wherein the scale of the meter is calibrated to read standing wave ratio.

8. The method of tuning an antenna to minimize standing waves caused by antenna mismatch with a transmitter comprising the steps of,
   loading the transmitter with a dummy load while tuning the transmitter, deriving a small portion of the signal from the transmitter to the dummy load and coupling it to the antenna, tuning the antenna with the small portion of the transmitter signal connected to the dummy load, connecting the tuned antenna to the transmitter for transmission and including the step of measuring the standing wave ratio by connecting the antenna in a bridge circuit deriving excitation from said small portion of the signal and tuning the antenna for a null current in the bridge circuit.

* * * * *